(12) United States Patent
Eitan (10) Patent No.: US 6,215,148 B1
(45) Date of Patent: Apr. 10, 2001

(54) NROM CELL WITH IMPROVED PROGRAMMING, ERASING AND CYCLING

(75) Inventor: Boaz Eitan, Ra'anana (IL)

(73) Assignee: Saifun Semiconductors Ltd., Netanya (IL)

( * ) Notice: Subject to any disclaimer, the term of this patent is extended or adjusted under 35 U.S.C. 154(b) by 0 days.

(21) Appl. No.: 09/082,280

(22) Filed: May 20, 1998

(51) Int. Cl.[7] ................................................. H01L 29/792
(52) U.S. Cl. .......................... 257/316; 257/324; 257/335; 345/184; 345/185.03; 345/185.28
(58) Field of Search .................................... 257/316, 324, 257/335; 345/184, 185.03, 185.28

(56) References Cited

U.S. PATENT DOCUMENTS

| | | | |
|---|---|---|---|
| 3,895,360 | * 7/1975 | Cricchi et al. | 340/173 R |
| 4,016,588 | * 4/1977 | Ohya et al. | 357/23 |
| 5,349,221 | 9/1994 | Shimoji | 257/324 |
| 5,424,567 | * 6/1995 | Chen | 257/315 |
| 5,518,942 | * 5/1996 | Shrivastava | 437/43 |
| 5,825,686 | 10/1998 | Schmitt-Lansiedel et al. | 365/185.03 |

FOREIGN PATENT DOCUMENTS 2 157 489   10/1995  (GB).

OTHER PUBLICATIONS

Chan, T.Y., et al., "A True Single–Transistor Oxide–Nitride–Oxide EEPROM Device," IEEE Electron Devide Letters, vol. EDL–8, No. 3, Mar. 1987, pp. 93–95, 1987.*

Oshima et al., "Process and Device Technologies for 16Mbit Eproms with Large—Tilt–Angle Implanted P–Pocket Cell" 1990 IEEE CH2865–4/90/0000–0095 IEDM 90–95 pp. 5.2.1–5.2.4.

* cited by examiner

Primary Examiner—Sara Crane
(74) Attorney, Agent, or Firm—Darby & Darby (57) ABSTRACT

A nitride programmable read only memory (NROM) cell with a pocket implant self-aligned to at least one bit line junction. Alternatively, the bit line junction(s) can have a thin area of effective programming and erasing located nearby. Further alternatively, the channel can have a threshold voltage level implant which has a low voltage level in a central area of the channel and which has a peak of high voltage level near at least one of the bit line junctions. With one pocket implant, the NROM cell stores one bit. With two pocket implants, the NROM cell stores two bits.

8 Claims, 12 Drawing Sheets

NROM CELL WITH IMPROVED PROGRAMMING, ERASING AND CYCLING

FIELD OF THE INVENTION

The present invention relates to FLASH, electrically erasable, programmable read only memory (EEPROM) and nitride, programmable read only memory (NROM) cells in general.

BACKGROUND OF THE INVENTION

Dual bit cells are known in the art although they are not common. Some dual bit cells have multiple threshold voltage levels, where every two threshold voltage levels together store a different bit. Others store one bit on either side of the cell. A dual bit cell of the latter kind, known as nitride, programmable read only memory (NROM) cell, is described in Applicant's copending U.S. patent application Ser. No. 08/905,286, entitled "Two Bit Non-Volatile Electrically Erasable And Programmable Semiconductor Memory Cell Utilizing symmetrical Charge Trapping" which was filed Aug. 1, 1997. The disclosure of the above-identified application is incorporated herein by reference.

Figure 1A:
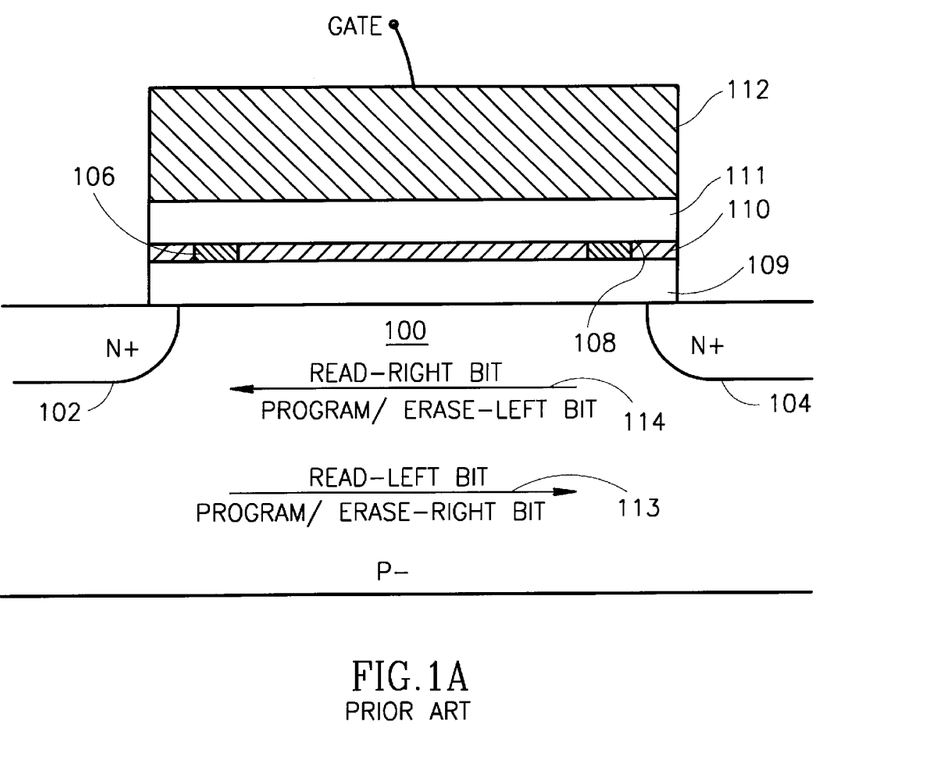
FIGS. 1A, 1B and 1C are schematic illustrations of the operation of a prior art dual bit, nitride programmable read only memory (NROM) cell.
Figure 1B:
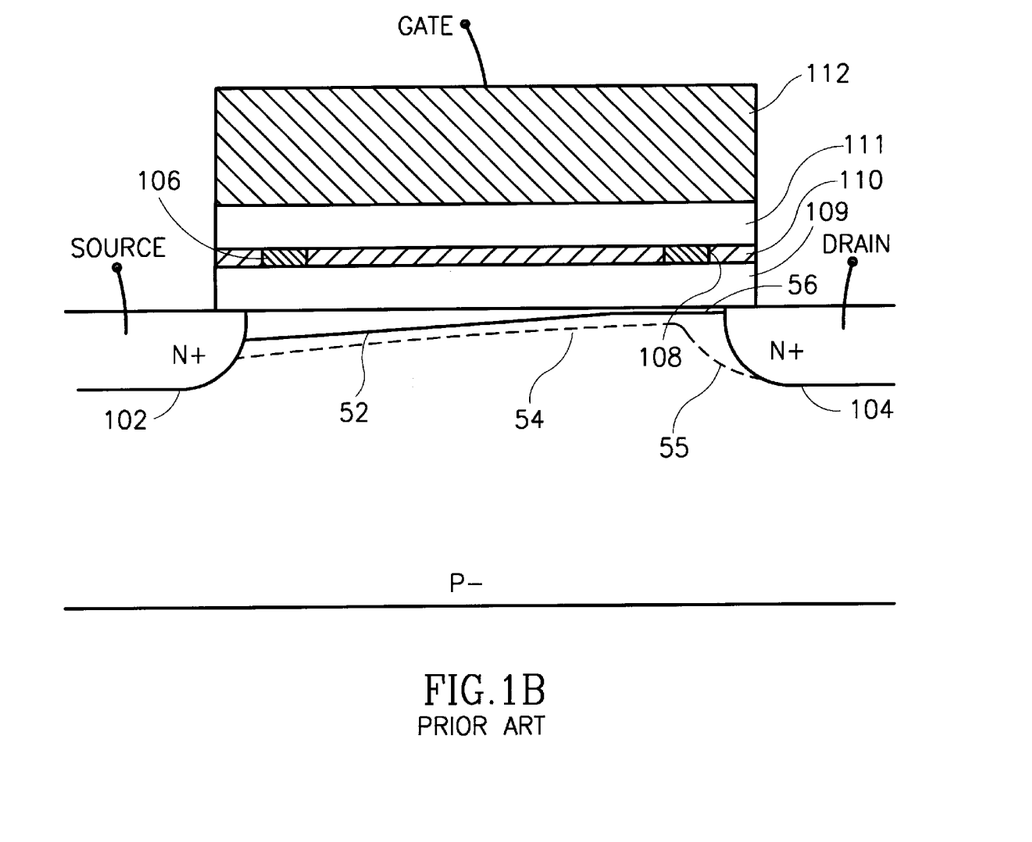
Figure 1C:
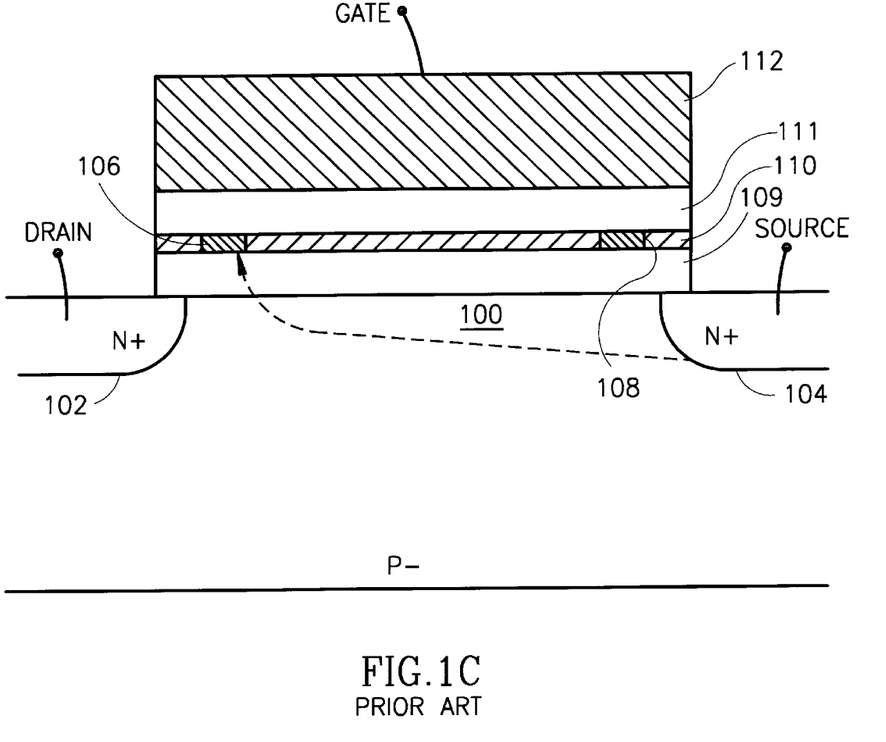

FIGS. 1A, 1B and 1C, to which reference is now made, schematically illustrate the dual bit NROM cell. The cell has a single channel 100 between two bit lines 102 and 104 but two separated and separately chargeable areas 106 and 108. Each area defines one bit. For the dual bit cell of FIG. 1, the separately chargeable areas 106 and 108 are found within a nitride layer 110 formed in an oxide-nitride-oxide sandwich (layers 109, 110 and 111) underneath a polysilicon layer 112.

To read the left bit, stored in area 106, right bit line 104 is the drain and left bit line 102 is the source. This is known as the "read through" direction, indicated by arrow 113. To read the right bit, stored in area 108, the cell is read in the opposite direction, indicated by arrow 114. Thus, left bit line 102 is the drain and right bit line 104 is the source.

FIG. 1B generally indicates what occurs within the cell during reading of the left bit of area 106. An analogous operation occurs when reading the right bit of area 108.

To read the left bit in area 106, the left bit line 102 receives the source voltage level $V_s$, typically of 0V, and the right bit line 104 receives the drain voltage $V_d$, typically of 2V. The gate receives a relatively low voltage $V_g$, which typically is a low voltage of 3V.

The presence of the gate and drain voltages $V_g$ and $V_d$, respectively, induce a depletion layer 54 and an inversion layer 52 in the center of channel 100. The drain voltage $V_d$ is large enough to induce a depletion region 55 near drain 104 which extends to the depletion layer 54 of channel 100. This is known as "barrier lowering" and it causes "punch-through" of electrons from the inversion layer 52 to the drain 104. The punch-through current is only minimally controlled by the presence of charge in right area 108 and thus, the left bit can be read irrespective of the presence or absence of charge in right area 108.

Since area 106 is near left bit line 102 which, for this case, acts as the source (i.e. low voltage level), the charge state of area 106 will determine whether or not the inversion layer 52 is extended to the source 102. If left area 106 has a threshold implant, then the voltage thereacross will not be sufficient to extend inversion layer 52 to the source 102 and a "0" will be read. The opposite is true if area 106 has no charge.

Like floating gate cells, the cell of FIGS. 1A and 1B is erasable and programmable. Thus, the charge stored in areas 106 and 108 can change over time in response to a user's request.

For NROM cells, each bit is programmed in the direction opposite that of its reading direction. Thus, to program left bit in area 106, left bit line 102 receives the high programming voltage (i.e. is the drain) and right bit line 104 is grounded (i.e. is the source). This is shown in FIG. 1C. The opposite is true for programming area 108.

The high programming voltage pulls electrons from the source 104. As the electrons speed up toward the drain 102, they eventually achieve enough energy to "jump" into the nitride layer 110. This is known as "hot electron injection" and it only occurs in the area close to the drain 102. When the drain voltage is no longer present, the oxide layer 109 prevents the electrons from moving back into the channel 100.

The bits are erased in the same directions that they are programmed. However, for erasure, a negative erasure voltage is provided to the gate 112 and a positive voltage is provided to the bit line which is to be the drain. Thus, to erase the charge in left area 106, the erase voltage is provided to left bit line 102. The highly negative erase voltage creates an electric field in the area near the left bit line 102 which pulls the electrons stored in the area close to the drain. However, the electric field is strong only close to the drain and thus, the charge in right area 108 is not depleted.

Typically, programming and erasure are performed with pulses of voltage on the drain and on the gate. After each pulse, a verify operation occurs in which the threshold voltage level of the cell (i.e. the level at which the cell passes current) is measured. During programming, the threshold voltage level Vtp is steadily increased so that the cell will not pass any significant current during a read operation. During erasure, the opposite is true; the threshold voltage level Vte is decreased until a significant current is present in the cell during reading.

Unfortunately, multiple erase and programming cycles change the number of pulses needed to achieve the desired threshold voltage levels. For the pulses, either the voltage level can remain constant and the number of pulses can be increased or the voltage level can be increased until the desired threshold voltage level is achieved.

The cell will no longer function once the gate voltage required for erasure is too negative and/or the number of programming pulses is reduced to one.

Figure 2A:
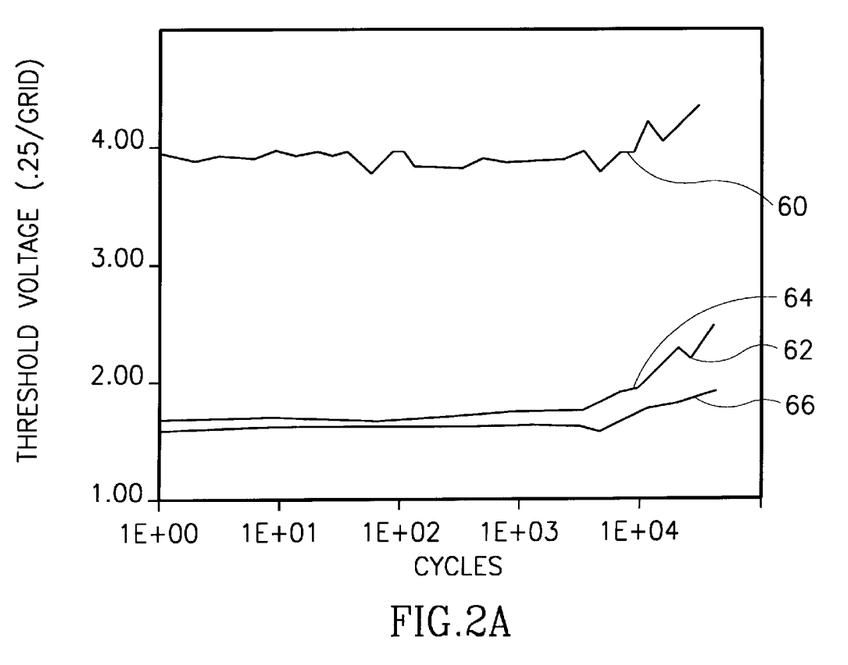
FIGS. 2A, 2B and 2C are graphical illustrations of experimental results of multiple programming and erase cycles, on log-linear charts.
Figure 2B:
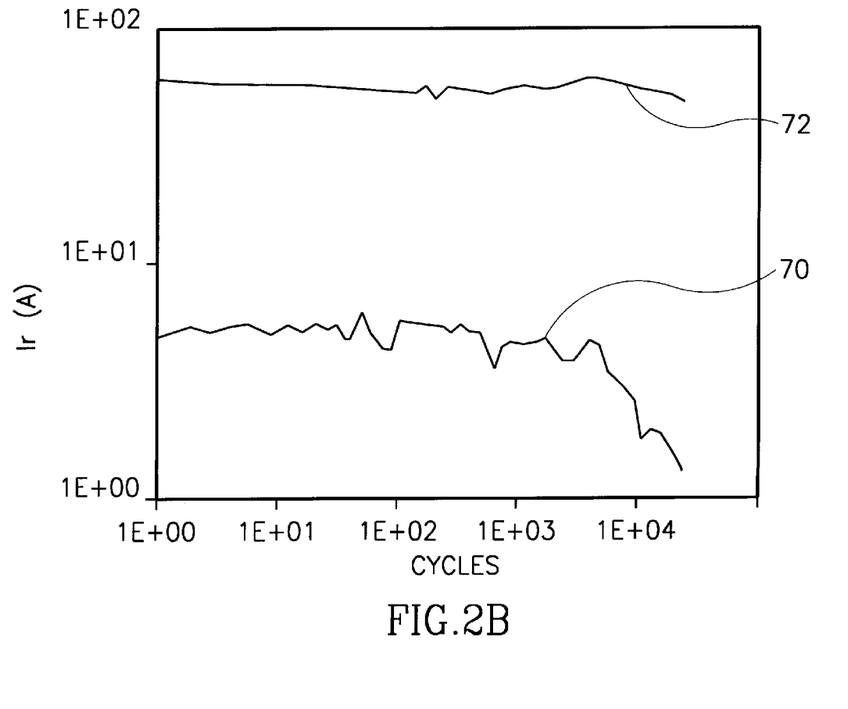
Figure 2C:
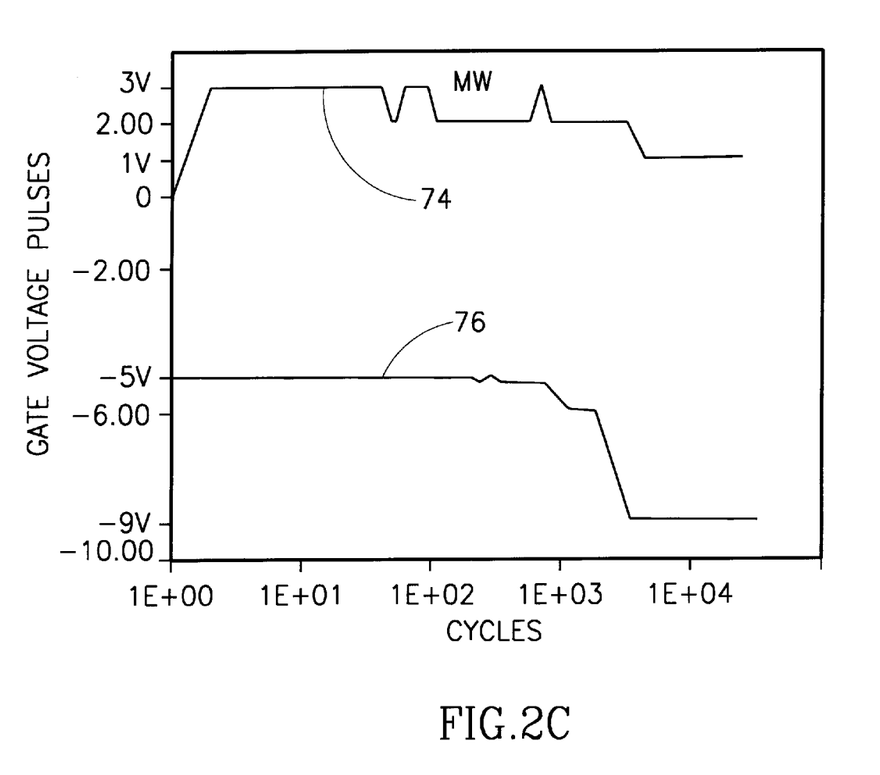

FIGS. 2A, 2B and 2C present experimental results of multiple programming and erase cycles, on log-linear charts. In this experiment, the gate voltage level for erasure was increased, as necessary, and the cell ceased to function after 20,000 cycles.

FIG. 2A graphs the programming and erase threshold voltage levels for both bits. Curves 60 and 62 illustrate the programming threshold voltage levels for the left and right bits, respectively, where the threshold voltage level for the right bit is measured in the forward (and not the reverse) direction. Curves 64 and 66 illustrate the erase threshold voltage levels for the left and right bits, respectively. It is noted that all curves remain relatively constant until about 2000 cycles at which point the threshold voltage levels increase. It is also noted that the programming threshold voltage level for the left bit, read in the reverse direction, is significantly higher than that for the right bit. However, the erase threshold voltage levels of each bit are smaller than their programming threshold voltage levels.

FIG. 2B illustrates the read current Ir after programming (curve 70) and after erasure (curve 72). The both currents decrease strongly after about 4000 cycles.

FIG. 2C illustrates the number of programming pulses (curve 74) and the gate voltage during erasure (curve 76). The number of programming pulses drops to one and the gate voltage drops from −6V to −9V after about 3000 cycles.

SUMMARY OF THE INVENTION

An object of the present invention is to provide an improved NROM cell which can endure an increased number of programming and erase cycles.

There is therefore provided, in accordance with a preferred embodiment of the present invention, an NROM cell having a double pocket implant self-aligned to at least one of its bit line junctions. Alternatively, the bit line junction(s) can have a thin area of effective programming and erasing located nearby. Further alternatively, the channel can have a threshold voltage level implant which has a low voltage level in a central area of the channel and which has a peak of high voltage level near at least one of the bit line junctions.

Specifically, in accordance with a preferred embodiment of the present invention, the NROM cell includes a channel, two diffusion areas on either side of the channel, each diffusion area having a junction with the channel, an oxide-nitride-oxide (ONO) layer over at least the channel, a polysilicon gate at least above the ONO layer and a pocket implant self-aligned to one or both of the junctions.

Moreover, in accordance with a preferred embodiment of the present invention, the pocket implant can be formed of one or two types of materials. If the latter is true, then the locations of maximum concentration of the two types of materials are separate from each other. For example, the two types of materials might be Boron and Phosphorous wherein the Boron has a location of maximum concentration closer to the junction than the location of maximum concentration of the Phosphorous.

Additionally, in accordance with a preferred embodiment of the present invention, a programmed bit has negative charge and an erased bit has positive charge stored in a portion of the ONO layer near the junction.

Further, in accordance with a preferred embodiment of the present invention, the two oxide layers of the ONO layer are of 50–100 Å and the nitride layer is 20–50 Å.

Still further, in accordance with a preferred embodiment of the present invention, the Boron implant is 30–120 Kev up to a dose of $1-5\times10^{13}$ per $cm^2$ and the Phosphorous implant is 30–100 Kev up to a dose of $0.5-2.5\times10^{13}$ per $cm^2$.

In accordance with an alternative preferred embodiment of the present invention, the NROM cell can include the channel, two diffusion areas on either side of the channel, an ONO layer, a polysilicon gate and a threshold voltage level implant which has a low voltage level in a central area of the channel and which has a peak of high voltage level near one or both of the junctions.

Further, in accordance with a preferred embodiment of the present invention, a programmed bit has negative charge and an erased bit has positive charge stored in a portion of the ONO layer near the peak(s) of threshold voltage.

Still further, in accordance with a preferred embodiment of the present invention, a programmed bit raises the effective threshold voltage level in the area of the peak to a level above the high voltage level and an erased bit lowers the effective threshold voltage level in the area of the peak to the low voltage level.

There is also provided, in accordance with a further alternate, preferred embodiment of the present invention, the NROM cell can include the channel, two diffusion areas on either side of the channel, an ONO layer, a polysilicon gate and a thin area of effective programming and erasing located near one or both of the junctions.

There is further provided, in accordance with a further alternate, preferred embodiment of the present invention, the NROM cell can include the channel, two diffusion areas on either side of the channel, an ONO layer, a polysilicon gate and means for enabling generally full erasure of previously programmed charge.

There is still further provided, in accordance with a further alternate, preferred embodiment of the present invention, the NROM cell can include the channel, two diffusion areas on either side of the channel, an ONO layer and a polysilicon gate. In this embodiment, a programmed bit has negative charge and an erased bit has positive charge stored in portions of the ONO layer near one or both of the junctions.

Additionally, in accordance with a preferred embodiment of the present invention, the amount of negative charge to be stored is less than twice a standard unit of negative charge.

Finally, in accordance with a preferred embodiment of the present invention, a programmed bit has a reduced electric field therein.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

Applicant believes that a significant source of the breakdown of the cell is charge trapped far from the relevant drain junction, which charge is hard to erase. This is shown in FIGS. 3A, 3B, 3C and 3D, to which reference is now made.

FIG. 3 show the charge stored in right area 108 of the nitride layer as a function of distance along the channel for one cell. FIG. 3A shows that, after the first cycle of programming, a significant amount of charge, labeled 80, is stored close to the right bit line, which is the drain for programming and erasure. As one moves away from the drain, the amount of charge reduces, eventually to zero. FIG. 3B shows the amount of charge, labeled 82, left after the first erase cycle. The erase electric field is typically so effective that it removes extra electrons (more than were present in charge 80) such that section 82 is positive while section 80 is negative. Section 82 is thus, hatched, to indicate that it is positively charged.

Figure 3A:
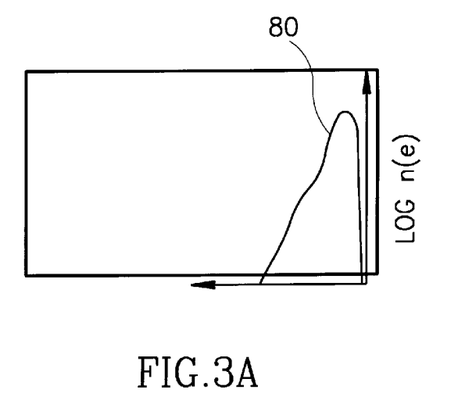
FIGS. 3A and 3B are schematic illustrations of the state of the NROM cell of the prior art after the first cycle of programming and erasure, respectively.
Figure 3B:
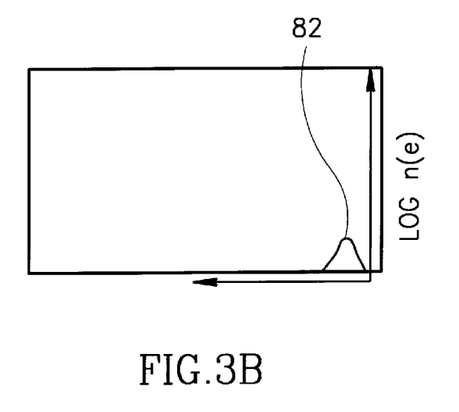
Figure 3C:
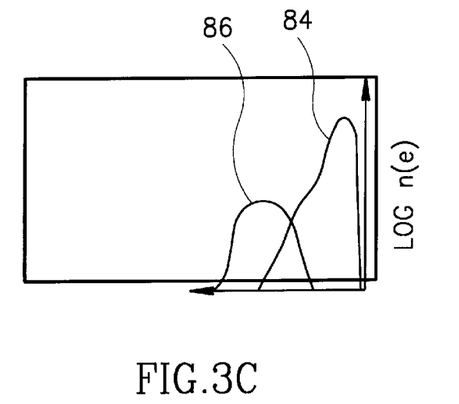
FIGS. 3C and 3D are schematic illustrations of the state of the NROM cell of the prior art after the $20,000^{th}$ cycle of programming and erasure, respectively.
Figure 3D:
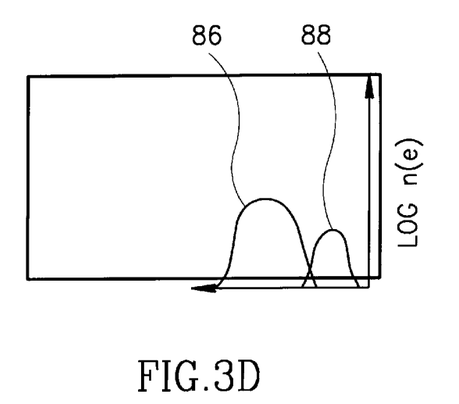

FIGS. 3C and 3D parallel FIGS. 3A and 3B, respectively, but for after 20,000 cycles. After programming, there is a significant charge, labeled 84, close to the drain, as in FIG. 3A. However, there is also another section of charge, labeled 86, further from the drain, which diffused there over time and was not erased during from previous erase cycles. After the 20,000$^{th}$ erase cycle, the extra section 86 still remains and is negatively charged, though the previously programmed section 84 has become positively charged section 88.

As can be understood from the above discussion, the diffused charge, in section 86, is not erased during erasure operations and remains trapped there. Trapped charge 86 acts as partially programmed charge. It is due to trapped charge 86 that the fewer and fewer programming pulses are required to achieve the programmed threshold voltage level (since the bit is already, in effect, partially programmed) and that more and more erasure pulses are required to achieve the erase threshold voltage level (since trapped charge 86 is not removed).

Furthermore, the trapped charge 86 effects the reverse read (curves 60 and 64 of FIG. 2A) but not the forward read (curves 62 and 66), which is why the two sets of curves are so different. The negative charge far from the source affects the reverse read since the forward read punches through the region under the trapped charge 86.

Applicant believes that the buildup of trapped charge 86 occurs due to slow hot electron programming in the areas away from the drain where the lateral electric field, though smaller, still is enough to inject electrons. Trapped charge 86 is not erased since the erase electric field is only strong enough to erase in the areas very close to the drain.

Applicant has realized that, to reduce the charge trapping "far" from the bit line junctions, the field far from the junctions must be reduced. However, this field reduction should not adversely affect the programming efficiency. Thus, the high field must be produced near the bit line junction only.

Figure 4A:
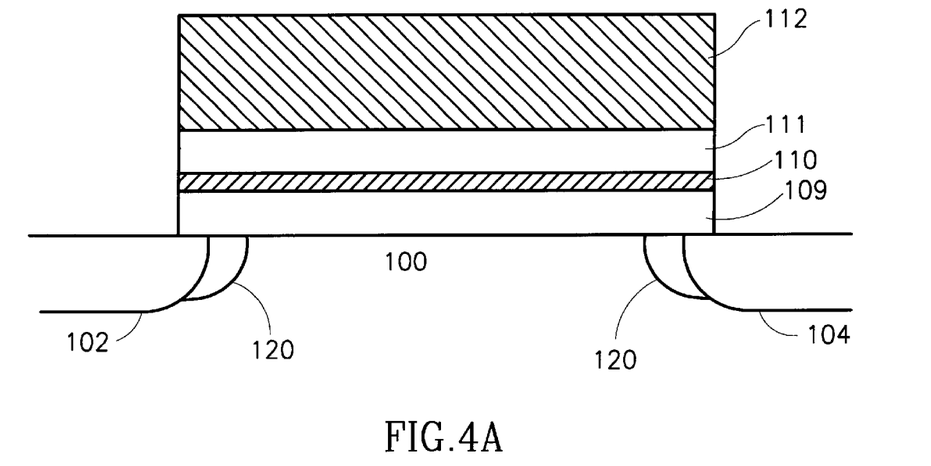
FIGS. 4A and 4B are schematic illustrations of two alternative embodiments of an NROM cell, constructed and operative in accordance with a preferred embodiment of the present invention, wherein the cell of FIG. 4A has single pocket implants and the cell of FIG. 4B has double pocket implants.
Figure 4B:
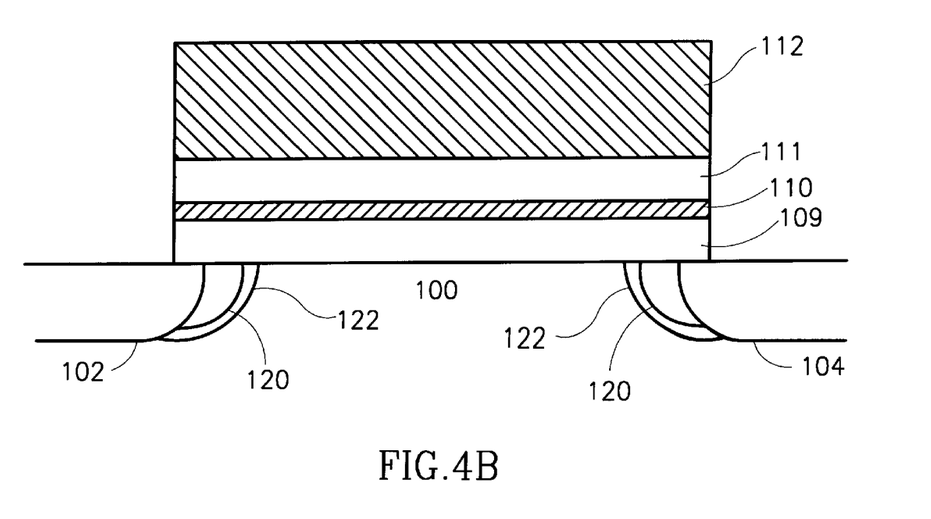
Figure 5A:
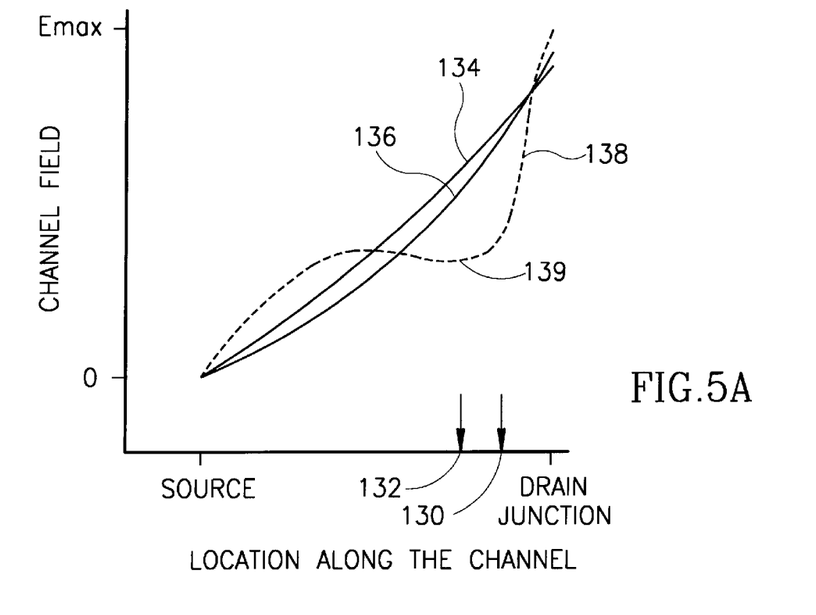
FIGS. 5A and 5B are graphical illustrations of the lateral channel field and the channel potential for the cells of FIGS. 4A and 4B.
Figure 5B:
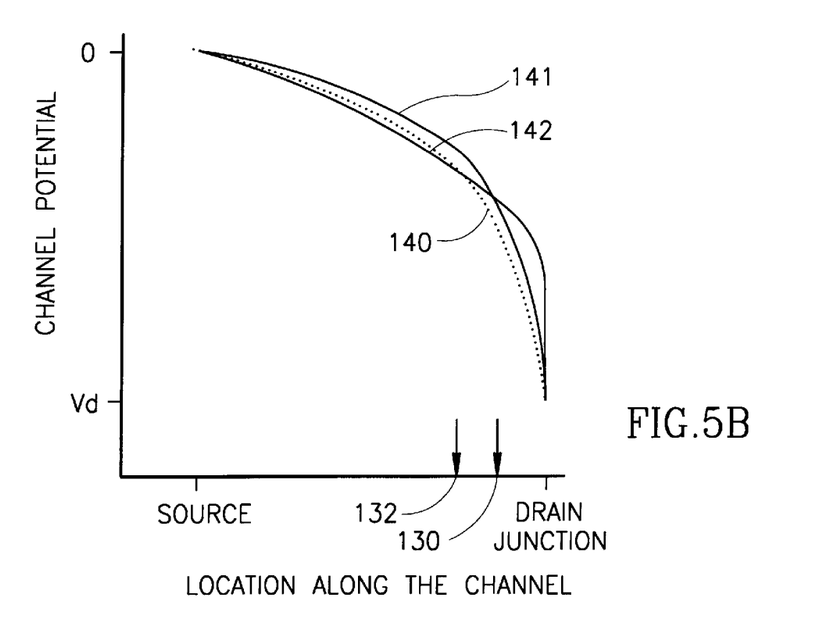

Reference is now made to FIGS. 4A and 4B which illustrate an NROM cell, constructed and operative in accordance with two preferred embodiments of the present invention. FIGS. 4A and 4B are similar to FIG. 1 and thus, similar reference numerals refer to similar elements. Reference is also made to FIGS. 5A and 5B which are graphs of the lateral channel field and the distribution of channel potential, respectively, for the NROM cells of FIGS. 4A and 4B and for a prior art NROM cell.

The NROM cell comprises the channel 100 between the bit lines 102 and 104, the oxide-nitride-oxide sandwich of layers 109, 110, 111, respectively, and the polysilicon gate 112. A blanket threshold implant is present in the channel, though not shown specifically. In addition, in accordance with preferred embodiments of the present invention, the NROM cell comprises either one or two extra implants self-aligned to each the junction of each bit line with the channel 100. FIG. 4A shows a Boron implant 120 and FIG. 4B shows Boron implant 120 with a Phosphorous implant 122.

The Boron implant 120 is designed to have a maximum concentration near the bit line 102 or 104 while the Phosphorous implant 122 is designed to have a maximum concentration away from the bit line 102 or 104.

The single pocket implant of Boron 120, in the embodiment of FIG. 4A, increases the threshold voltage level and, correspondingly, the lateral field, of the cell in the area near each bit line. Since Boron creates holes and Phosphorous creates free electrons, the combined profile, in the embodiment of FIG. 4B, is the difference of the two concentrations throughout the channel. Thus, the "double pocket" implant heightens the lateral field near the bit lines 102 and 104 but significantly reduces the lateral field in the rest of the channel 100.

In both embodiments, the implants are used to shape the lateral channel field so that it is high only close to the bit line junction and so that it drops significantly thereafter. This is shown in FIGS. 5A and 5B which graph of the channel field and potential, respectively, versus the location along the channel 100 for the right bit, for both embodiments and for the prior art. For these figures, the left bit line acts as the source and the right bit line acts as the drain. Position 130 is the location of the maximum concentration of Boron and position 132 is the location of the maximum concentration of the Phosphorous implant, if present.

In each Figure, three curves are shown. For FIG. 5A, curve 134 indicates the lateral field with only a blanket threshold Vt implant, curve 136 indicates the lateral field with a single pocket implant, and curve 138 indicates the lateral field with the double pocket implant.

As can be seen in curve 134, when only a blanket Vt implant is present, the lateral field gently increases in the direction of the drain junction. Similarly for the lateral field of a cell with a single pocket implant, except that, as shown in curve 136, the field is lower throughout most of the channel, increasing significantly in the vicinity of the Boron implant, near the drain junction. In fact, near the drain junction, the cell with the single pocket implant has a stronger lateral field than the cell with no pocket implants (curve 134).

For the double pocket implant, as seen in curve 138, the lateral field has a sharp dip 139 in the vicinity of the maximum concentration 132 of the Phosphorous implant and increases sharply toward the drain junction. It is noted that the lateral field is higher near the drain for the double implant than for either the single implant or no implant.

Similarly, for the channel potential of FIG. 5B. Curve 140 graphs the potential for an NROM cell without no implants, curve 141 graphs the potential of a cell with the single pocket implant and curve 142 graphs the potential of a cell with the double pocket implant. The channel potential starts at the 0V of the source and drops towards the negative Vd of the drain for all embodiments.

With the double pocket implant, the drain voltage is present only in the very close vicinity of the drain (curve 142). For the single pocket implant (curve 141), the drain voltage is spread over a slightly larger area near the drain while for the cell of no implants (curve 140), the drain voltage is spread over a significant area away from the drain.

As indicated by FIGS. 5A and 5B, the single and double pocket implants maintain the effect of the drain voltage (high lateral field and strongly negative voltage level) in the vicinity of the drain. For the double pocket implant, there is a sharp drop-off away from the drain.

For both embodiments, the generally thin area of effect forces the programmed charge to remain in a thin area of the nitride 110 (FIG. 4). This improves programming speed when programming 'this' bit. Furthermore, since the programmed charge is maintained in an area near the drain, the erase voltage generally removes all of the charge for this bit. The thin area of effect also ensures effective punchthrough when reading the 'other' bit.

Figure 6:
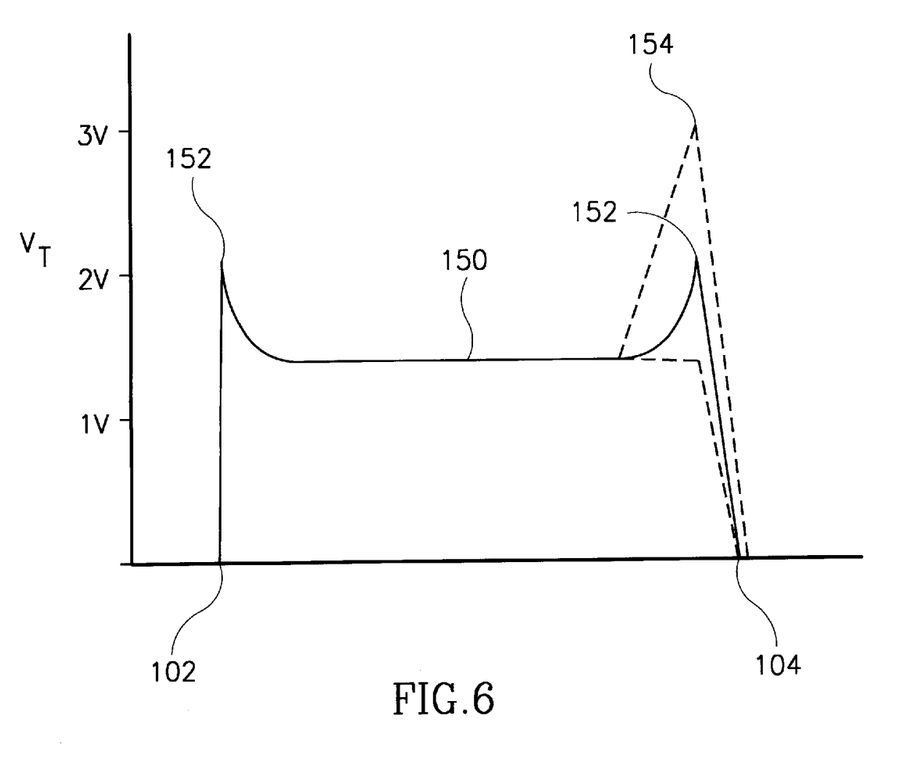
FIG. 6 is a graphical illustration of the general shape of the threshold voltage level for the cells of FIGS. 4A and 4B.

Reference is now made to FIG. 6 which illustrates the threshold voltage level throughout the cell after implantation. As can be seen, the threshold voltage level is low (labeled 150) throughout most of the channel with peaks 152 near the bit line junctions 102 and 104. The height and width of the peaks 152 is a function of the number of implants (one or two) and the locations of maximum concentration of the implant or implants. In general, the general threshold voltage level 150 is at a low level, of about 1V, while the peaks 152 reach a much higher level, such as about 2V.

Thus, in the areas to be programmed, the threshold voltage level of the cell starts higher than the standard 1.5V. Furthermore, once a bit has been programmed, for example, with a single unit −Q of charge, the threshold voltage level in the area of interest rises to a programmed level 154, such as of 3V. The programmed threshold voltage level is indicated with dashed lines.

Upon erasure, the threshold voltage level of the cell, as indicated with dotted lines, drops to the general level 150 of the center of the cell. As this is below the original threshold voltage level 152 in the drain area, the cell is now erased to a positive charge level, for example of +Q, at least in the area near the bit line junction. To reprogram the cell, one must provide enough negative charge to counter the positive erase state and to bring the cell to the negative level of being programmed. This is opposed to the prior art which programs to the negative level of being programmed (e.g. −2Q) and erases to the initial, non-charged state (e.g. 0).

It will be appreciated that measuring the change in state between the negative charge, such as −0, of programming and the positive charge, such as +Q, of erasure is generally easier than measuring, as in the prior art, the difference between the negative charge −2Q of programming and the non-charged state of erasure 0Q. It will further be appreciated that the ratio of positive to negative charge does not have to be equal; other ratios, such as 0.25:1.75 are also possible and are incorporated into the present invention.

It will still further be appreciated that the low amounts of charge (−1Q or −1.75Q vs. −2Q) reduce the size of the field caused by the presence of charge within the nitride layer. This reduced field helps retain the charge within its desired location.

Furthermore, since only the threshold voltage level of the peaks 152 is actively involved in the programming and erasure process, the general level 150 of the center of the cell can be set to any desired low level.

Reference is now made to FIGS. 7A, 7B, 7C, 7D, 7E and 7F which illustrate an exemplary method of producing the cell of the present invention.

Figure 7A:
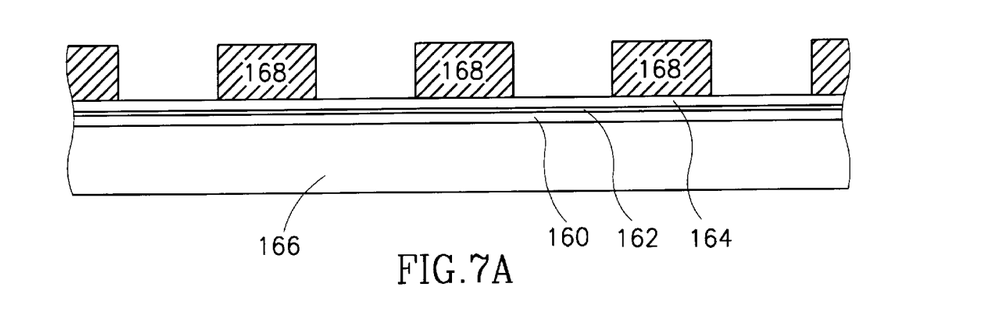
FIGS. 7A, 7B, 7C, 7D, 7E and 7F are schematic illustrations of the manufacturing process for a row of NROM cells of the present invention.

Initially, and as shown in FIG. 7A, the oxide, nitride and oxide layers 160, 162 and 164, respectively, are grown on top of a substrate 166, to form the basis of the ONO structure. Typical thicknesses of layers 160, 162 and 164 are 50–100 Å, 20–50 Å, 50–100 Å, respectively. If desired, a p-well or blanket threshold implant, of $5–10^3$ per $cm^3$ can be provided to the substrate 166 prior to growing the ONO layers.

A bit line mask 168 is laid down next. The mask is formed of columns laid over the locations of the future channels. The bit lines are to be implanted between the columns 168 and are thus, self-aligned to the future channels. The bit line mask can be formed of a hardened photoresist or of a thick oxide.

In accordance with a preferred embodiment of the present invention, the bit line mask 168 is a layer of photoresist hardened with ultraviolet (UV) after being laid down. This makes a hard mask which is not removable using the standard photoresist removal solvents.

An alternative bit line mask 168 can be formed of a thick oxide layer, of a minimal thickness of 1000 Å. Such a mask is formed by first depositing a thick oxide layer, typically utilizing the low pressure, chemical vapor deposit (LPCVD) process. A layer of photoresist is then deposited in the desired column pattern after which the oxide found between the photoresist columns is etched away, typically using a dry etch process. The photoresist layer is removed and the thick oxide, bit line mask 168 remains. The thick oxide mask cannot be removed during standard, solvent, photoresist removal techniques.

Figure 7B:
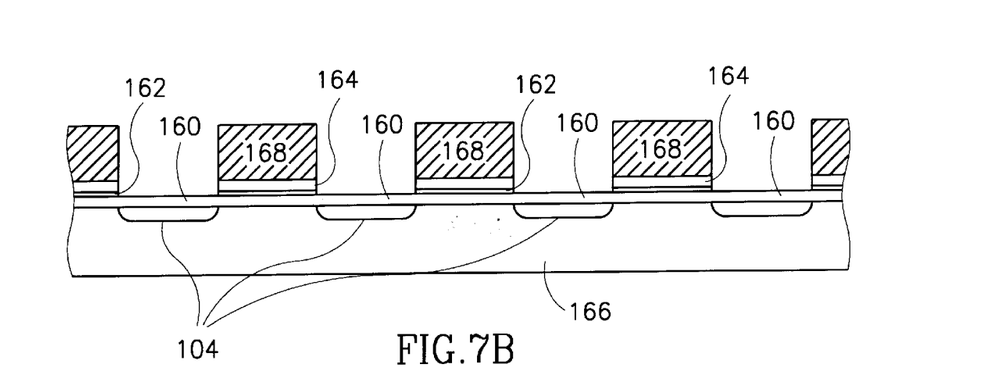

As shown in FIG. 7B, the ONO layers are etched, using a dry etch or wet/dry combination, to remove the oxide and nitride layers between the columns of the bit line mask 168. The lower oxide layer 160 remains between the columns of the bit line mask 168 to implant through the oxide. This is commonly performed in the art to reduce channeling.

The bit lines 104 are then implanted between the columns of the bit line mask 168. Typically, the implant operation is 45 Kev of Arsenic, up to a dose of $2–6\times10^{15}$ per $cm^2$. Other implants and dosage levels are also contemplated and are within the scope of the present invention.

At this point, the right and left bit line junctions of each cell are separately implanted. For each side, the same operation occurs. A threshold pocket implant, of one or two implant materials, is provided at an angle to the vertical, thereby implanting, in a self-aligned manner, into the bit line junctions as well as into part of the open bit lines near the bit line junctions. The process is then repeated for the other side.

Figure 7C:
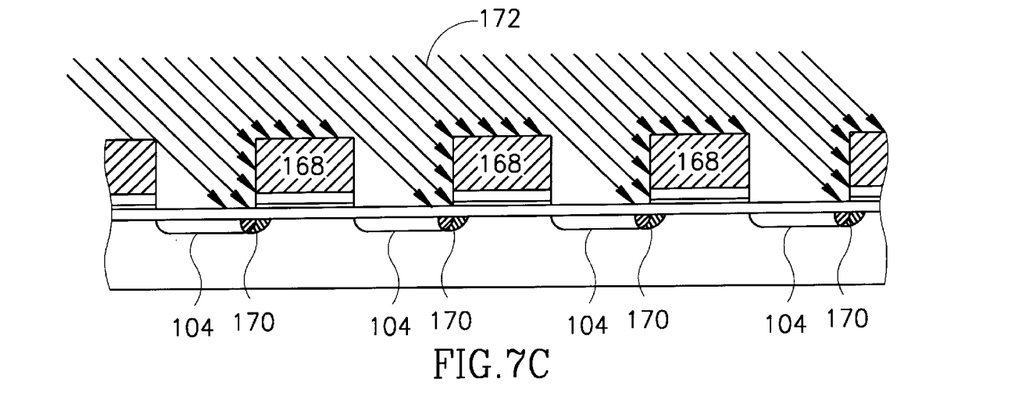

FIG. 7C shows the operation for left bit line junctions 170 of one row of cells and indicates the threshold implant with arrows 172. The implant can be any suitable threshold pocket implant. For a single implant, it can be Boron at 30–120 Kev up to a dose of $1–5\times10^{13}$ per $cm^2$. The second implant, if there is one, can be Phosphorous at 30–100 Kev up to a dose of $0.5–2.5\times10^{13}$ per $cm^2$. The remaining discussion of the manufacturing process will use the term "implant" to refer to either a single implant or a double implant unless otherwise stated.

The implant is at an angle of 15–45° to the right of vertical. Since the bit line mask 168 covers the channels of all cells, the implant has access only to the left bit line junctions. The implant is to the right of the vertical since the left bit line junctions are on the right of the open bit lines (which is to the left of the neighboring channel). As indicated by the arrows 172, the angled implant accesses the left bit line junction and a portion of the open bit lines to the left of the junction. The implant is, thus, self-aligned to the left bit line junctions 170 of the channels.

The implant dosage must be high enough to ensure sufficient implantation into the channel portion of the bit line junction such that some implant remains even if the bit line later diffuses into the channel. The implant which reaches the rightmost portion of the bit line has no effect on the function of the cell; instead, the implant adds to the bit line implant dosage. Since the threshold implant dosage is two orders of magnitude lower than the bit line implant dosage, it does not affect the dosage within the bit line.

The choice of angle is typically based on the desired location of maximum concentration for each implant material and is typically 15–45°. The thickness of the bit line mask 168 affects the amount of shadowing and is a function of the angle of the implant, as follows:

Let S be the amount of the bit line 104, from the bit line mask 168, to be shadowed, let h1 be the thickness of the bit line mask 168 and let a be the angle from the vertical of the implant, then:

$$S = h1 * \tan \alpha$$

For example, if the desired shadowing S is 800 Å and the angle α is 20°, then the thickness h1 is 2197 Å.

Figure 7D:
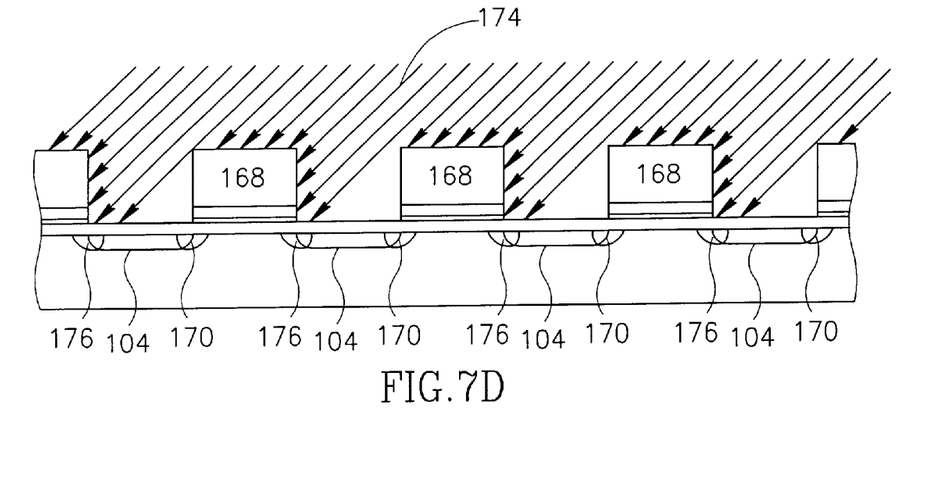

FIG. 7D illustrates the threshold implant operation for the right bit line junctions 176. The implant, labeled by arrows 174, is at the same angle as before; however, for the right bit line junctions 176, the implant angle is to the left of vertical.

It will be appreciated that the bit line mask 168 is both a bit line mask and a threshold pocket implant mask. Thus, the bit line implant can occur before the pocket implants, as shown, or afterwards. It will further be appreciated that the order for implanting the pocket implant into the right and left bit line junctions is not significant nor does it affect the self-alignment of the implants to the bit line junctions.

Once all of the relevant bit line junctions have been implanted, the bit line mask 168 is removed. For UV hardened photoresist, this process involves a plasma removal process of the top photoresist layer followed by standard solvent photoresist removal techniques. If the bit line mask 168 is formed of a thick oxide layer, it is removed with a standard wet etch.

Figure 7E:
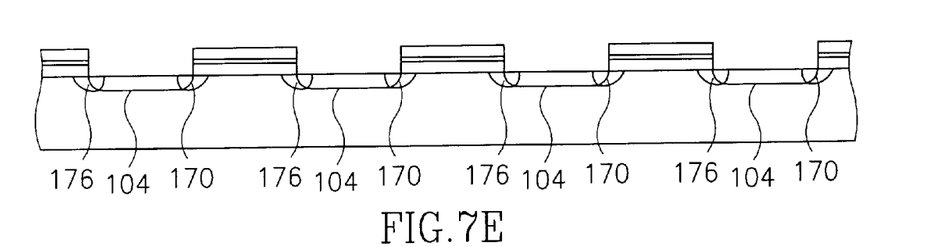

Following removal of all of the photoresist elements, the sacrificial oxide layer 160 is removed using a wet etch. The result is shown in FIG. 7E. Within substrate 166 are the bit lines 104 and the implanted bit line junctions 170 and 176. If the bit line mask 168 is formed of a thick oxide layer, the sacrificial oxide layer 160 is removed together with the bit line mask.

The memory array is now finished in accordance with standard CMOS (complementary, metal-oxide semiconductor) process techniques. The two steps of interest are the gate oxide growth step and the polysilicon word line deposition.

A gate oxide layer is now thermally grown over the entire array using standard oxidation techniques. The gate oxide layer 20 is typically grown to a thickness of 30–150 Å over the channels 100.

Figure 7F:
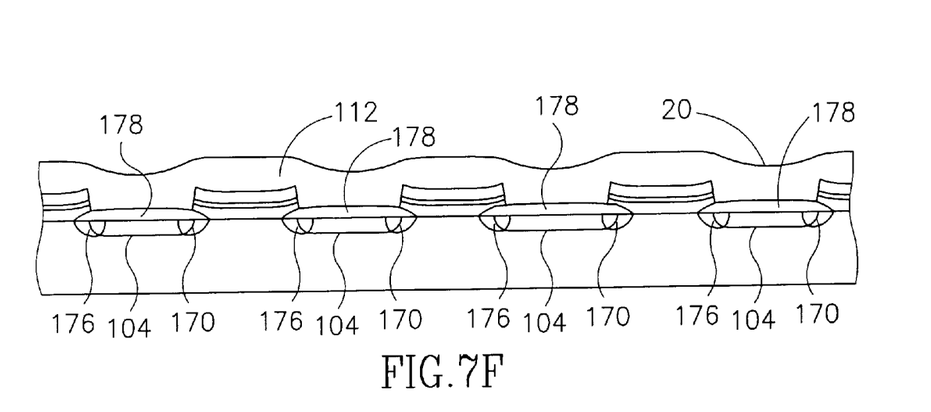

In the array, the oxidation step causes oxide, labeled 178 in FIG. 7F, to grow over the bit lines 104. Due to the presence of the nitride in the ONO elements, little oxide is added onto the top of the ONO elements. Due to the presence of implant in the bit line, the oxide over the bit line is thick. If the bit line oxide must be even thicker, an oxidation step can also occur after the implant steps.

As noted hereinabove and as shown in FIG. 7F, when the gate oxide is grown, the gate oxide layer 20 is 2–3 times thicker over the bit lines 104 due to the presence therein of the bit line implant material. If the gate oxide is deposited, this is not true.

It is noted that the oxidation step occurs after the bit lines have been implanted. If the oxide is grown, the bit lines might diffuse outwardly for lack of an oxide cap. This can contaminate the CMOS area of the chip. In accordance with a preferred embodiment of the present invention, the oxide growth step provides a small amount of oxygen to the oven while slowly ramping the temperature therein, thereby capping the chip with a thin layer of oxide. The ramp typically begins at 700° C. Once the desired temperature is reached, the full amount of oxide should be placed in the oven.

The final step is the deposition of the polysilicon gates and word lines, in accordance with standard deposition techniques. The result is the row shown in FIG. 7E.

The standard CMOS backend continues at this point without any special mask to protect the array.

Figure 8A:
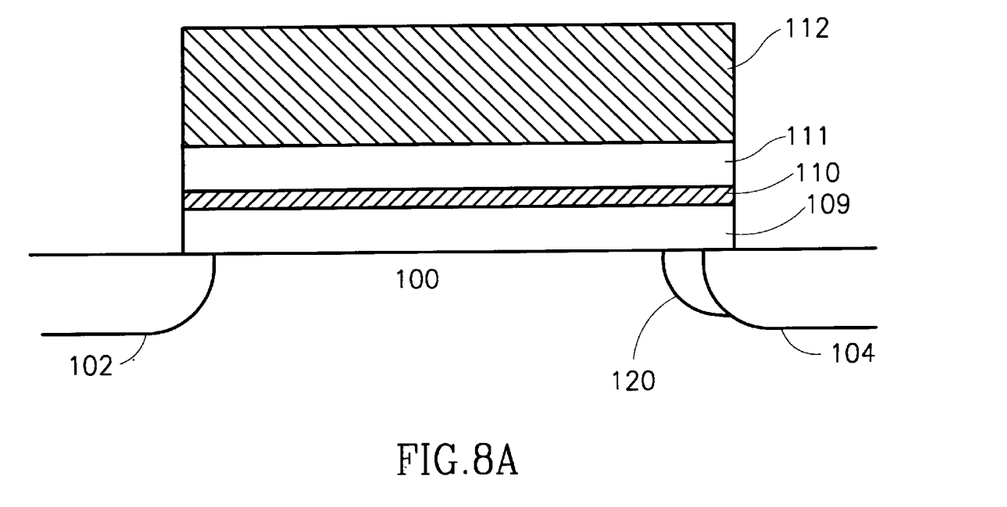
FIGS. 8A and 8B are schematic illustrations of two single bit embodiments of an NROM cell, constructed and operative in accordance with a second preferred embodiment of the present invention, wherein the cell of FIG. 8A has a single pocket implant and the cell of FIG. 8B has a double pocket implant.
Figure 8B:
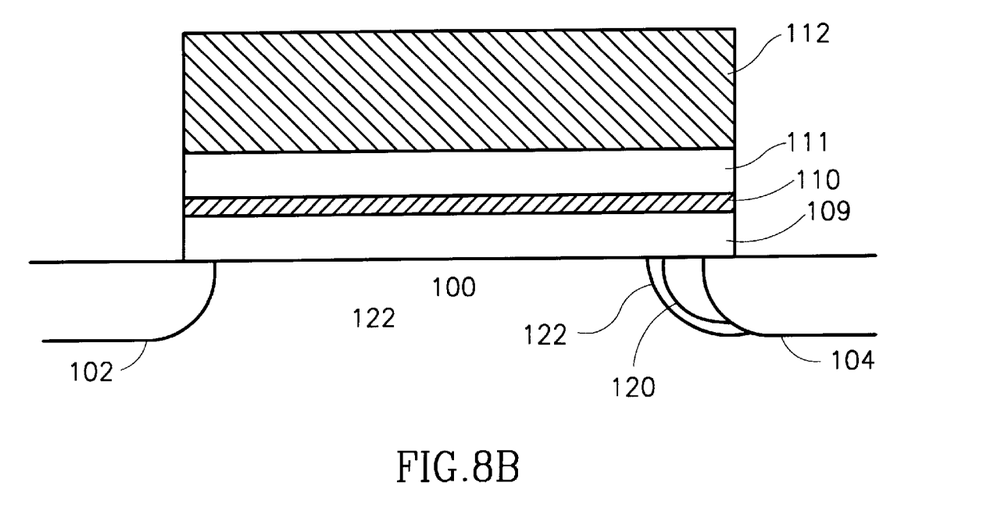

Reference is now briefly made to FIGS. 8A and 8B which show alternative embodiments of the present invention for single bit NROM cells. FIG. 8A shows an NROM cell having a single pocket implant 120 on the right side of the cell while FIG. 8B shows an NROM cell having two pocket implants 120 and 122 on the right side of the cell.

It will be appreciated that the two, single bit cells of FIGS. 8A and 8B have the same properties as the double bit cells of FIGS. 4A and 4B. Thus, the improved qualities of the lateral field and channel potential of FIGS. 5A and 5B, respectively, are applicable to the cells of FIGS. 8A and 8B during programming, when the right bit line 104 is the drain.

It will further be appreciated that the selective threshold levels of FIG. 6 are also applicable to the single bit cells of FIGS. 8A and 8B. Specifically, the threshold voltage level is low (labeled 150) throughout most of the channel with peaks 152 near the right bit line junction 104.

It will be appreciated by persons skilled in the art that the present invention is not limited by what has been particularly shown and described herein above. Rather the scope of the invention is defined by the claims that follow:

What is claimed is:

1. A nitride programmable read only memory (NROM) cell comprising:

a channel;

two diffusion areas, one on either side of said channel, each diffusion area having a junction with said channel;

an oxide-nitride-oxide (ONO) layer at least over said channel;

a polysilicon gate at least above said ONO layer; and a concentration of p-type dopant where the maximum concentration of said dopant is in an upper corner of said channel next to at least one of said junctions.

2. A cell according to claim 1 and wherein said p-type dopant is formed of a single type of material.

3. A cell according to claim 1 and also including an n-type dopant, whose location of maximum concentration is separate from a location of maximum concentration of said p-type dopant.

4. A cell according to claim 3 and wherein said p-type dopant has a location of maximum concentration closer to said at least one junction than the location of maximum concentration of said n-type dopant.

5. A cell according to claim 1 and wherein a programmed bit has negative charge and an erased bit has positive charge stored in a portion of said ONO layer near said at least one of said junctions.

6. A cell according to claim 1 and wherein said at least one of said junctions is both of said junctions.

7. A cell according to claim 1 and wherein the two oxide layers of the ONO layer are of 50–100 Å and the nitride layer is 20–50 Å.

8. A cell according to claim 4 and wherein said p-type dopant is Boron and said n-type dopant is Phosphorous, wherein said Boron dopant is a dose of $1-5\times10^{13}$ per $cm^2$ and wherein said Phosphorous dopant is a dose of $0.5-2.5\times10^{13}$ per $cm^2$.

* * * * *